United States Patent [19]
Fried et al.

[11] Patent Number: 5,631,806
[45] Date of Patent: May 20, 1997

[54] LEAD WITH SLITS FOR REDUCING SOLDER OVERFLOW AND ELIMINATING AIR GAPS IN THE EXECUTION OF SOLDER JOINTS

[76] Inventors: Robert Fried, 80 Northern Pkwy., West Plainview, N.Y. 11803; Kuo J. Tseng, Twenty Chang Road 3rd Fl. 66-2, Hsin, Taipei; Hsi Y. Hsiao, 278 Alley 37 Lane, 4th Fl. 10-3, Taipei, both of Taiwan

[21] Appl. No.: 509,378

[22] Filed: Jul. 31, 1995

[51] Int. Cl.⁶ .......................... H01L 23/488; H05K 3/34; B23K 35/14; H01R 4/02
[52] U.S. Cl. .......................... 361/773; 361/772; 361/728; 174/261; 228/179.1; 228/180.1; 228/180.21; 228/258; 257/692; 257/693; 439/874
[58] Field of Search .......................... 361/728, 733, 361/772, 773, 777; 228/258, 180.1, 180.21, 180.22, 179.1, 165; 257/909, 692, 693; 174/261, 263; 439/874, 876; 29/840, 877, 878, 879

[56] References Cited

U.S. PATENT DOCUMENTS

| | | | |
|---|---|---|---|
| 3,275,736 | 9/1966 | Hotine et al. | 174/261 |
| 4,303,935 | 12/1981 | Ragaly | 257/909 |
| 4,328,512 | 5/1982 | Heyke et al. | 257/909 |
| 4,987,474 | 1/1991 | Yasuhara et al. | 174/52.4 |
| 5,371,647 | 12/1994 | Fried et al. | 257/909 |
| 5,460,319 | 10/1995 | Kato | 228/180.1 |

*Primary Examiner*—Donald Sparks
*Assistant Examiner*—John B. Vigushin
*Attorney, Agent, or Firm*—Robert L. Epstein, Esq.; Harold James, Esq.; James & Franklin

[57] ABSTRACT

The portion of the lead which is soldered between electrical components in a circuit module includes one or more radially extending slits. Once heated, the fluid solder is drawn into the slits by capillary action. Trapped air escapes, eliminating air pockets or gaps. The result is a stronger joint and a reduction in solder overflow.

18 Claims, 4 Drawing Sheets

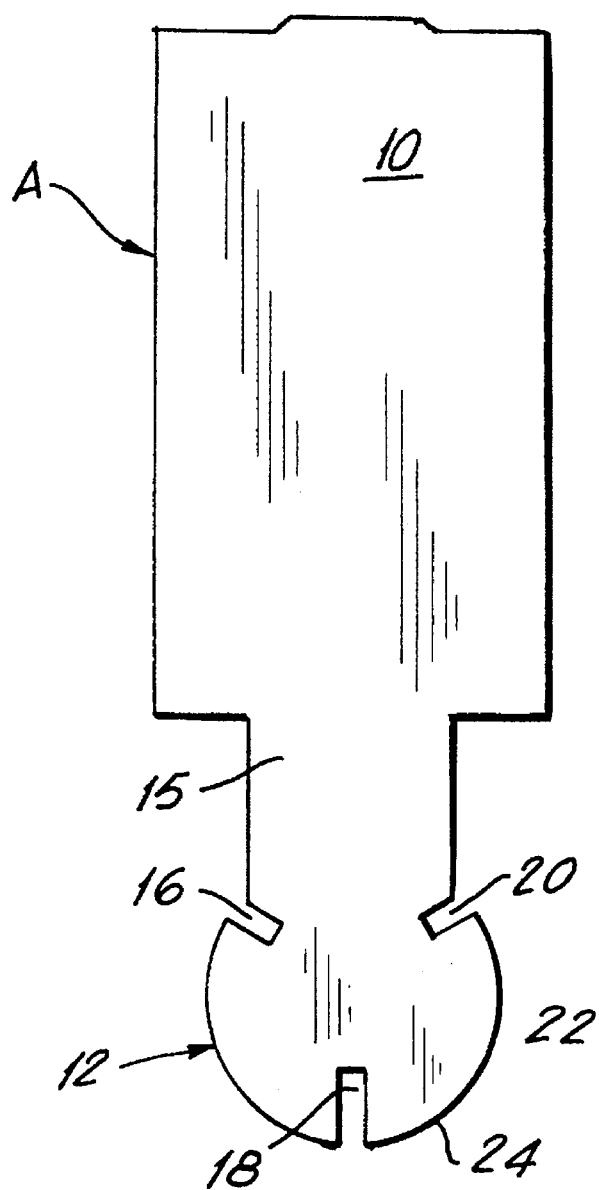
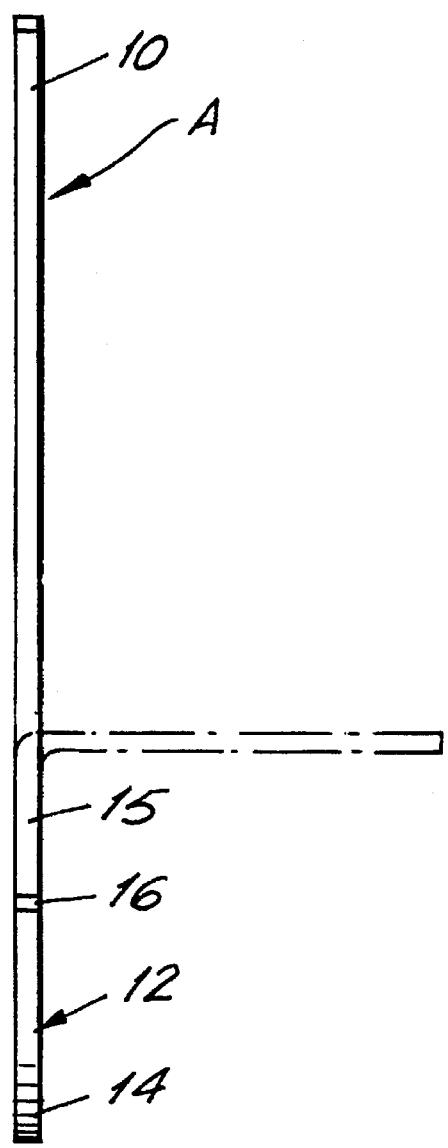
F I G. 1  F I G. 2

LEAD WITH SLITS FOR REDUCING SOLDER OVERFLOW AND ELIMINATING AIR GAPS IN THE EXECUTION OF SOLDER JOINTS

The present invention relates to the formation of solder joints between components in a circuit module and more particularly, to a lead structure which improves the strength of the joints, eliminates air gaps and reduces solder overflow.

Leads are commonly soldered to electrical circuit components such as diodes in circuit modules. It is necessary that the solder joint made be as physically strong as possible, particularly where the module is designed for use in an environment where it may be exposed to external forces or vibration. It is also important that excess solder not be permitted to flow onto other portions of the lead or other components. Such excess solder may prevent the proper closing of the plastic case which encloses the module or may prevent the leads from plugging into a tight tolerance socket. These problems may become particularly troublesome when soldering a lead between circuit components so that two joints are formed simultaneously.

To overcome these problems, we propose to create one or more radially directed slits in the tab portion of the lead which is adapted to be soldered between components. Once heated, capillary action causes the fluid solder to be drawn into the slits which, at the same time, permit trapped air to escape. Excess solder collects in the slits to reduce solder overflow.

It has been experimentally determined that this structure results in a joint between components which is better able to resist mechanical and electrical stress. At the same time, the problem of excess solder, particularly significant when modules are mass produced because proper closure of the module case is prevented, is dramatically reduced. Also, proper fit into a tight tolerance socket is assured.

It is, therefore, a prime object of present invention to provide a lead structure which results in solder joints of improved strength.

It is another object of the present invention to provide a lead structure including a tab with one or more radially extending slits.

In accordance with one aspect of the present invention, a lead adapted to be soldered to an electrical component in a circuit module or the like is provided. The lead includes a first part adapted to extend beyond the module for external electrical connection and a second part adapted to be jointed to the electrical component. The second part of the lead includes an interior portion and ah edge. A first slit extends from the interior portion toward the edge.

The interior portion may be center of the second part. The first slit is situated along a line extending from the center to the edge of the second part.

The second part may be a substantially round section with a radius. The first slit may extend along the radius.

The lead may include a second slit. The second slit may extend radially.

The second part may include a substantially round section with first and second radii. The first and second slits may extend along the first and second radii, respectively.

The second part may also include a third slit. The slits may extend radially and be circumferentially spaced.

In accordance with another aspect of the present invention, a circuit module is provided including first and second electrical components and a lead adapted to be joined between the components by solder. The lead includes a first part extending beyond the module for external electrical connection and a second part situated between the electrical components. The second part of the led includes an interior portion and an edge. A first slit extends from the interior portion toward the edge.

The interior portion of the second part may be the center. The first slit may be situated along a line extending from the center to the edge.

The second part may include a substantially round section with a radius. The first slit may extend along the radius.

The second part may include a second slit. The second slit also may extend radially.

The second part may include a substantially round section. First, second and third slits may be present and extend radially. The slits may be spaced circumferentially.

To these and to such other objects which hereinafter may appear, the present invention relates to a lead with slits for improved solder joints, as set forth in the following specification and recited in the annexed claims, taken together with the accompanying drawings, wherein like numerals refer to like parts, and in which:

FIG. 1 is a plan view of preferred embodiment of the lead structure of the present invention; and FIG. 2 is a side view of the lead of FIG. 1;

Figure 3:
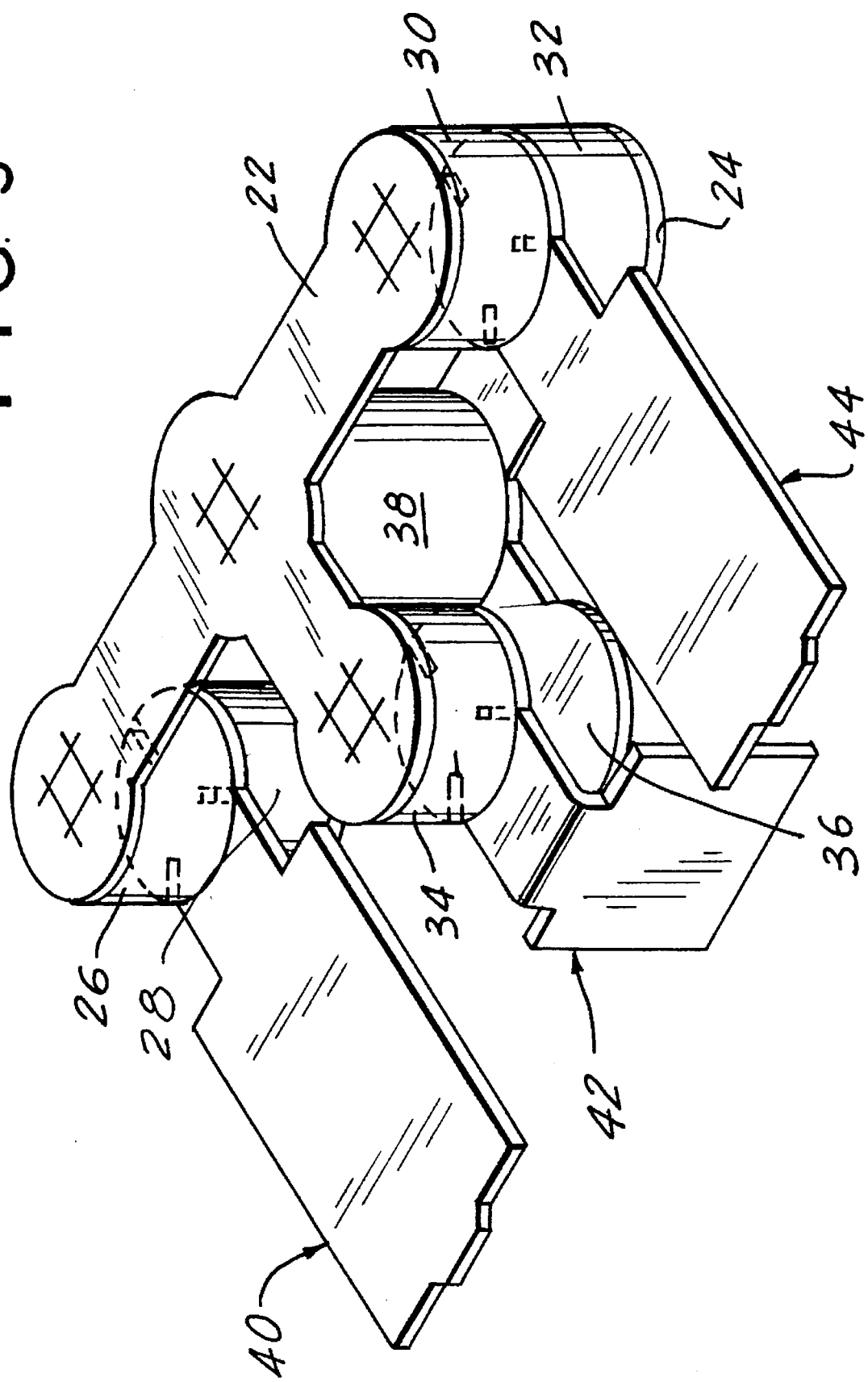
FIG. 3 is an isometric of a circuit module including leads of the type illustrated in FIGS. 1 and 2.

The present invention can best be appreciated in the context of a circuit module, such as the surge protection circuit module disclosed in U.S. Pat. No. 5,371,647 issued Dec. 6, 1994 to Fried et al. entitled "Surge Protection Circuit Module and Method For Assembling Same". However, it should be understood that the invention is not limited to this application and the patented module is disclosed herein for illustrative purposes only.

The Fried et al. patent describes a surge protection circuit for a telecommunications line which includes six steering diodes and an ungated Thyristor. Three spaced, parallel leads are employed. Each lead is soldered between a pair of aligned diodes. The diode pairs and Thyristor are, in turn, soldered between a pair of spaced parallel conductive plates.

As shown in FIGS. 1 and 2, the lead structure of the present invention includes a lead, generally designated A, which comprises an external part 10 and an internal part 12. Part 12 includes a substantially circular tab 14. Preferably, lead A is stamped out of a single sheet of conductive material, such as metal.

External part 10 of lead A may be substantially rectangular in configuration and is adapted provide a terminal for external electrical connection. Tab 14 has a substantially circular configuration to match the disk-like shape of the diodes between which it is soldered.

Neck portion 15 of lead A forms a bridge between external part 10 and tab 14. Portion 15 may be bent, as seen in phantom in FIG. 2, in the event that a lead which is other than planar is required.

Tab 14 is preferably provided with three radially extending, circumferentially spaced, slits 16, 18, 20. Slits 16, 18, 20 extend along circumferentially spaced radii from the center 22 toward the edge 24 of the tab.

Slits 16, 18 and 20 each provide a recess which draws fluid solder by capillary action. The solder which fills the slits contacts with surfaces of both components simultaneously, forming a single direct electrical connection between the components. As the solder flows into the slits, the slits allow trapped air to escape, eliminating air pockets or gaps. The result is a joint which is much more resistant to torque and has increased pull strength as well, as compared to solder joints formed under similar conditions with conventional leads.

Moreover, the slits attract any excess solder which may be present. This reduces overflow discards normally present in mass production due to improper fit of the plastic case for the module are greatly reduced.

The circuit module illustrated on FIG. 3 is shown without its case. The module includes a pair of spaced conductive "T" shaped plates 22, 24, three pairs of diodes 26 and 28, 30 and 32, 34 and 36, and a Thyrister 38. Three leads 40, 42 and 44 are provided. Lead 40 is soldered between diodes 26 and 28. Lead 42 is soldered between diodes 34 and 36. Lead 44 is soldered between diodes 30 and 32. The neck portion 15 of lead 42 is bent at a right angle with respect to the internal part.

Figure 4:
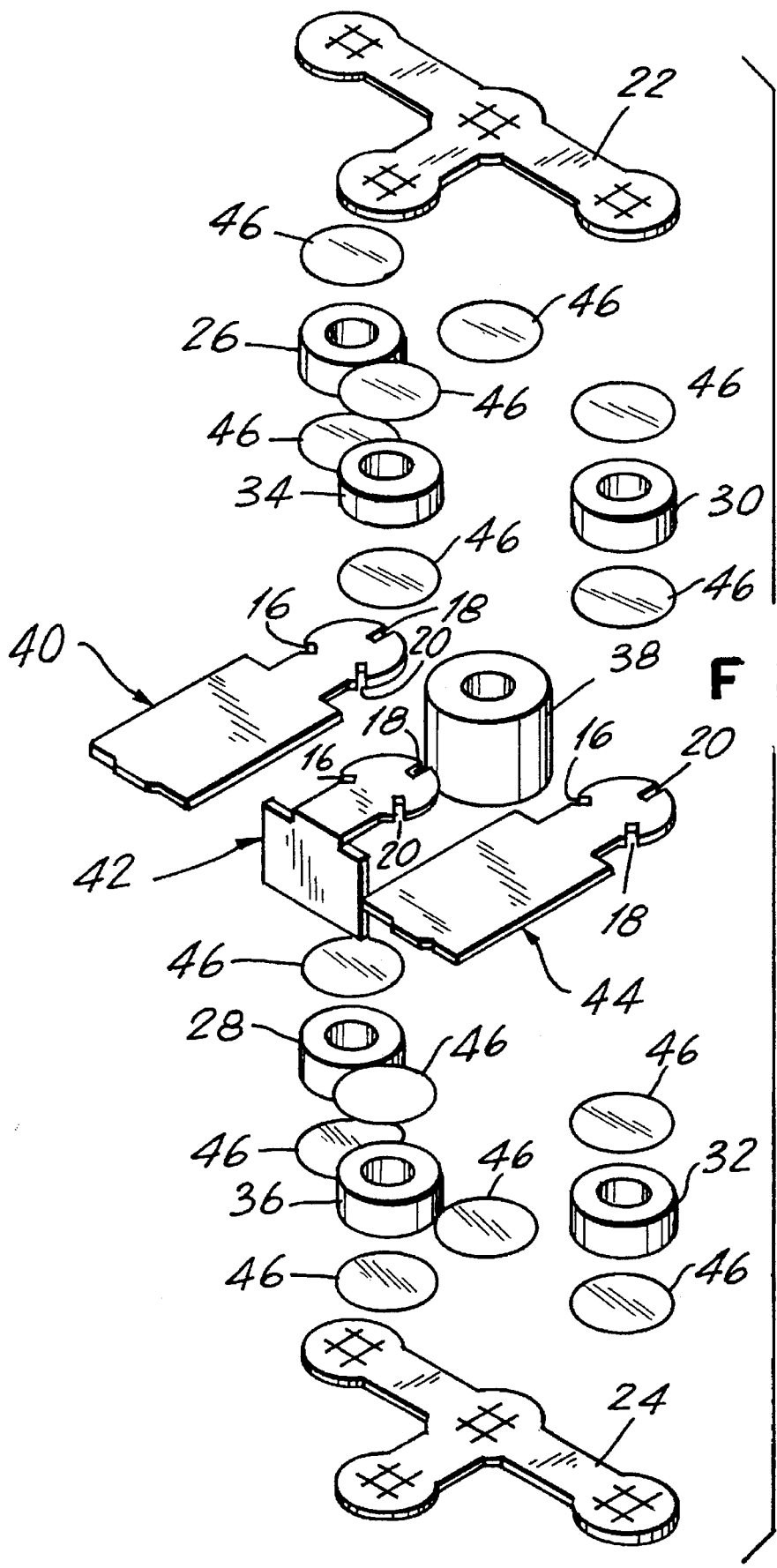
FIG. 4 is an exploded isometric view of the module of FIG. 3.

As best seen in FIG. 4, the components of the circuit module are joined together using conventional solder preforms 46. Preforms are simply disks of a predetermined quantity of solder material. In mass production of the modules, once the components and preforms are correctly positioned in a solder fixture, the entire unit is heated in a furnace to solder all of the joints simultaneously.

The tab portion 14 of each of the leads 40, 42 and 44 is situated between two solder preforms 46 prior to heating. Once in the furnace, the heated solder becomes fluid and is drawn into the slits in the tabs. The solder cools and hardens after the unit is removed from the furnace.

Figure 6:
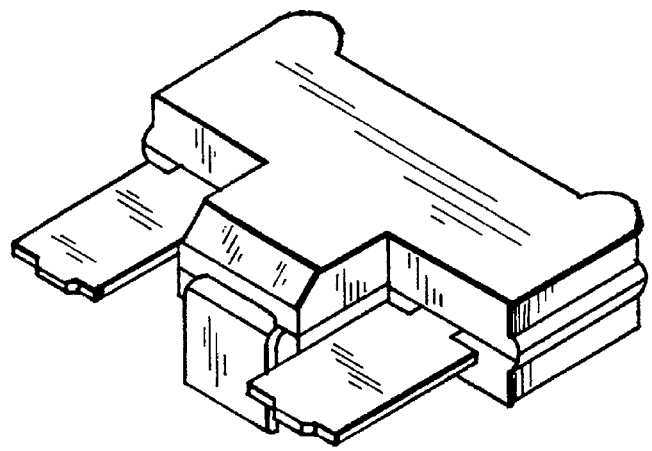
FIG. 6 is an isometric view of the module with the case closed.
Figure 5:
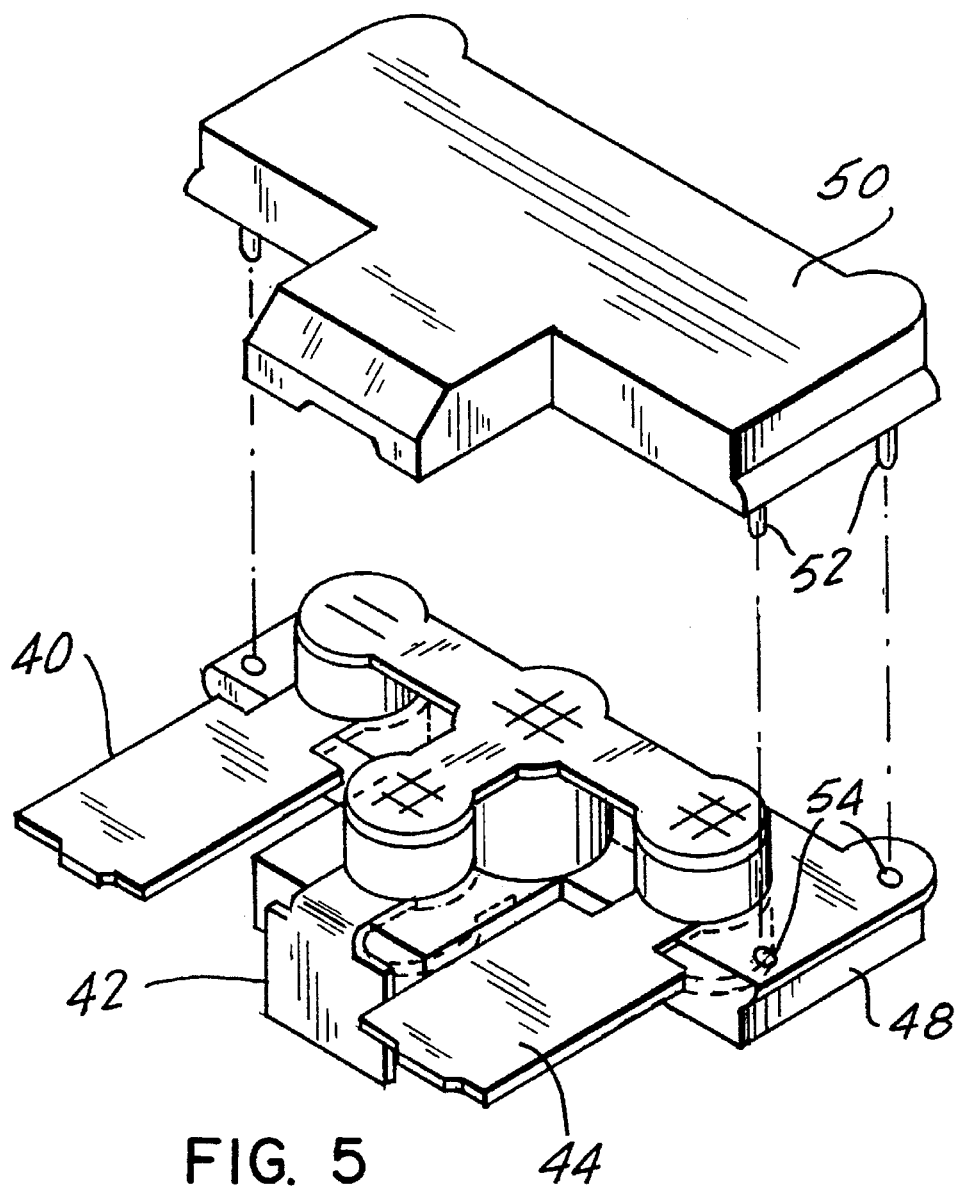
FIG. 5 is an exploded isometric view of a plastic case for the module of FIG. 3.

As seen in FIG. 5, the completed unit is situated in a "snap-on" plastic case consisting of injection molded top and bottom plastic halves 48 and 50. The top half 50 of the case is provided with protrusions 52 which friction fit into recesses 54 in bottom half 48. One of the advantages of the present invention is that excess solder does not tend to accumulate on or around the leads. Thus, discards due to excess solder interfering with case closure are greatly reduced. FIG. 6 illustrates the module with the case properly closed.

It should now be appreciated that the present invention relates to a lead with slits for an improved solder joint. With the structure of the present invention, the strength of the solder joint is increased, air pockets are eliminated and excess solder is reduced.

While only a single embodiment of the present invention is disclosed herein for purposes of illustration, it is obvious that many modifications and variations could be made thereto. It is intended to cover all of these modifications and variations which fall within the scope of the present invention, as defined by the following claims:

We claim:

1. A lead to be soldered to an electrical component in a circuit module, said lead comprising a first part adapted to extend beyond the module for external electrical connection and a second part adapted to be joined to the electrical component, said second part of said lead comprising a substantially planar interior solid portion and an edge, and a first slit in said second part extending from said interior portion towards said edge.

2. The lead of claim 1 wherein said second part has a center and wherein said first slit is situated along a line extending from said center to said edge.

3. The lead of claim 1 wherein said second part comprises a substantially round section with a radius and where said first slit extends along said radius.

4. The lead of claim 1 further comprising a second circumferentially spaced slit in said second part.

5. The lead of claim 4 wherein said second slit extends from said interior portion towards said edge.

6. The lead of claim 4 wherein said second part comprises a substantially round section with first and second radii and wherein said first and second slits extend along said first and second radii, respectively.

7. The lead of claim 4 further comprising a third circumferentially spaced slit in said second part.

8. The lead of claim 7 wherein said third slit extends from said interior portion towards said edge.

9. The lead of claim 7 wherein said second part comprises a substantially round section with first, second and third radii and wherein said first, second and third slits extend along said first, second and third radii, respectively.

10. A circuit module comprising first and second electrical components and a lead to be soldered between said components, said lead comprising a first part adapted to extend beyond said module for external electrical connection and a second part situated between said components, said second part of said lead comprising an interior portion and an edge, and a first slit extending from said interior portion towards said edge.

11. The module of claim 10 wherein said second part comprises a center and wherein said first slit is situated along a line extending from said center to said edge.

12. The module of claim 10 wherein said second part comprises a substantially round section with a radius and wherein said first slit is situated along said radius.

13. The module of claim 10 further comprising a second circumferentially spaced slit in said second part.

14. The module of claim 13 wherein said second slit extends from said interior portion towards said edge.

15. The module of claim 13 wherein said second part comprises a substantially round section with first and second radii and wherein said first and second slits extend along said first and second radii, respectively.

16. The module of claim 13 further comprising a third circumferentially spaced slit in said second part.

17. The module of claim 16 wherein said third slit extends from said interior portion towards said edge.

18. The module of claim 16 wherein said second part comprises a substantially round section with first, second and third radii and wherein said first, second and third slits extend along said first, second and third radii, respectively.

* * * * *